(12) United States Patent
Schott

(10) Patent No.: US 7,965,076 B2
(45) Date of Patent: Jun. 21, 2011

(54) MAGNETIC FIELD ORIENTATION SENSOR

(75) Inventor: Christian Schott, Bevaix (CH)

(73) Assignee: Melexis NV, Microelectronic Integrated Systems, Ypres (BE)

(*) Notice: Subject to any disclaimer, the term of this patent is extended or adjusted under 35 U.S.C. 154(b) by 402 days.

(21) Appl. No.: 12/133,189

(22) Filed: Jun. 4, 2008

(65) Prior Publication Data

US 2009/0121707 A1    May 14, 2009

(30) Foreign Application Priority Data

Jun. 4, 2007  (GB) .................................. 0710625.5
Jul. 16, 2007 (GB) ...................................... 0713763

(51) Int. Cl.
*G01R 33/07* (2006.01)
*H01L 43/06* (2006.01)
*G01B 7/30* (2006.01)

(52) U.S. Cl. ...................................... 324/251; 324/207.2
(58) Field of Classification Search .................. 324/251, 324/207.2; 327/510, 511; 338/32 H; 257/425, 257/426, 427

See application file for complete search history.

(56) References Cited

U.S. PATENT DOCUMENTS

| | | | |
|---|---|---|---|
| 4,668,914 A * | 5/1987 | Kersten et al. ............... 324/251 |
| 4,761,569 A | 8/1988 | Higgs | |
| 5,541,506 A | 7/1996 | Kawakita et al. | |
| 5,572,058 A | 11/1996 | Biard | |
| 5,612,618 A | 3/1997 | Arakawa | |
| 5,619,137 A | 4/1997 | Vig et al. | |
| 5,621,319 A | 4/1997 | Bilotti et al. | |
| 5,657,189 A | 8/1997 | Sandhu | |
| 5,694,038 A | 12/1997 | Moody et al. | |
| 5,831,513 A | 11/1998 | Lue | |
| 5,844,411 A | 12/1998 | Vogt | |

(Continued)

FOREIGN PATENT DOCUMENTS

DE    10 2005 014 509 A1    10/2006

(Continued)

OTHER PUBLICATIONS

"3235 Dual-Output Hall-Effect Switch," pp. 4-64 thru 4-67.

(Continued)

*Primary Examiner* — Kenneth J Whittington
(74) *Attorney, Agent, or Firm* — Kilpatrick Townsend & Stockton LLP

(57) ABSTRACT

A magnetic angle sensor 100 comprises a bulk substrate; a circular well 101 provided upon the bulk substrate; an even numbered plurality of electrodes 102a-102x spaced at regular intervals in a ring formation over the circular well; and a pair of biasing electrodes for selectively applying a progressive succession of differently directed bias currents 104 to and/or using the said ring of electrodes 102 to provide a succession of Hall potentials indicative of the relative magnitude of successive differently oriented magnetic field components B in the plane of the magnetic angle sensor 100. The sensor 100 operates cyclically and the full progressive succession cycle involves applying and/or using each electrode 102 in the ring at least once for applying a bias current and/or sensing a Hall potential. In such a manner, the full cycle comprises the progressive succession of the axis of measurement of the sensor 100 through a complete rotation within the plane of the sensor. By monitoring the phase of the generated signal or monitoring the zero crossings of the generated signal the orientation of the magnetic field coin the plane of the sensor can be determined.

19 Claims, 10 Drawing Sheets

U.S. PATENT DOCUMENTS

| | | | |
|---|---|---|---|
| 5,942,895 A | | 8/1999 | Popovic et al. |
| 6,064,199 A | | 5/2000 | Walter et al. |
| 6,064,202 A | * | 5/2000 | Steiner et al. ............ 324/251 |
| 6,091,239 A | | 7/2000 | Vig et al. |
| 6,100,680 A | | 8/2000 | Vig et al. |
| 6,265,864 B1 | | 7/2001 | De Winter et al. |
| 6,356,741 B1 | | 3/2002 | Bilotti et al. |

FOREIGN PATENT DOCUMENTS

| | | |
|---|---|---|
| EP | 0 631 416 A2 | 12/1994 |
| EP | 0875733 A2 | 11/1998 |
| JP | 62048160 | 2/1987 |
| WO | WO 2008/145662 A1 | 12/2008 |

OTHER PUBLICATIONS

"Sensor Signal Conditioning: an IC Designer's Perspective," Sensors, pp. 23-30 (Nov. 1991).

Gilbert, J., "Product Description—Technical Advances in Hall-Effect Sensing," Allegro MicroSystems, Inc., pp. 1-8 (May 10, 2000).

P. Kejik, Circular Hall Transducer for Angular Position Sensing, Transducers & Eurosensors '07, pp. 2593-2596, The 14$^{th}$ International Conference on Solid-State Sensors, Actuators and Microsystems, Lyon, France.

European Search Report based on EP 08 01 0109 dated Aug. 18, 2010.

\* cited by examiner

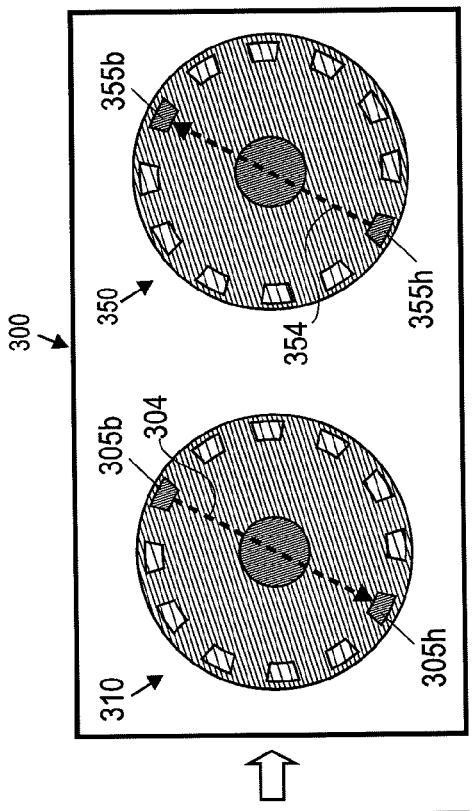
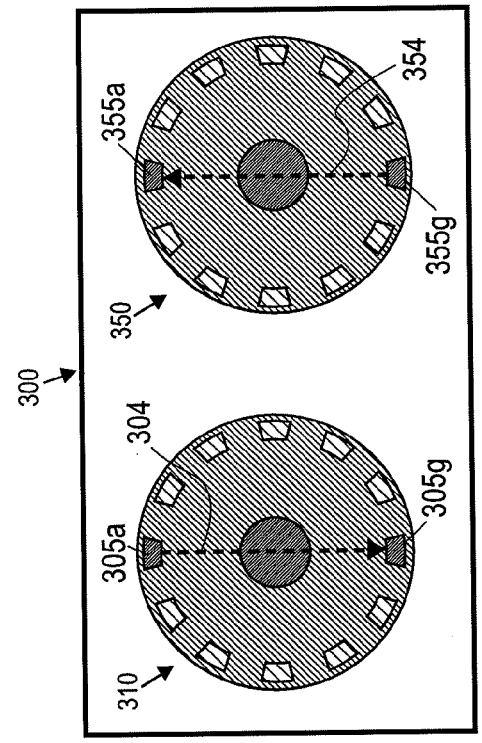
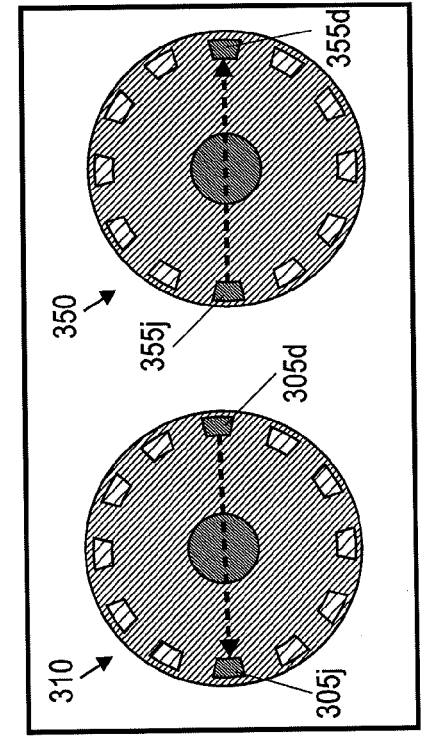
FIG. 12A  FIG. 12B
FIG. 12C  FIG. 12D

MAGNETIC FIELD ORIENTATION SENSOR

The present invention relates to a sensor operable to determine the orientation of a magnetic field component and in particular to determine the orientation of a magnetic field component lying in a particular plane relative to a particular predetermined axis in that plane.

Magnetic sensors operable to determine the orientation of a particular field component are utilised in a number of applications to sense a rotary position of, say, a bar magnet mounted on a rotatable object. By monitoring the field orientation it is then possible to estimate the rotational orientation of the object.

Typically such sensors might comprise one or more pairs of mutually orthogonal Hall elements operable to determine the magnitude of the magnetic field components in two mutually perpendicular directions.

It is an object of the present invention to provide a new form of magnetic orientation sensor.

According to a first aspect of the present invention there is provided a magnetic angle sensor comprising: a bulk substrate; a circular well provided upon the bulk substrate; an even numbered plurality of electrodes spaced at regular intervals in a ring formation over the circular well; and means for selectively applying a progressive succession of differently directed bias currents to and/or using the said ring of electrodes to provide a succession of Hall potentials indicative of the relative magnitude of successive differently oriented magnetic field components in the plane of the magnetic angle sensor.

Such a configuration enables the sensor to be operable to determine the orientation of the local magnetic field component in the plane of the sensor.

The well must be sufficiently deep that the bias current between the two biasing electrodes does not flow solely along the surface of the well. If the well is insufficiently deep no Hall potential will be generated. Preferably, the electrode ring is concentric with the well.

The circular well may be a well of n type material. The electrodes may be formed from n+ type material. In an alternative embodiment, the well may be formed from p type material and the electrodes may be formed of p+ type material. The n type embodiment is preferred as the generated signal is typically approximately three times larger due to the higher mobility of electrons as compared to holes.

If the well and electrodes are n type, then the substrate is preferably lightly p doped silicon. Conversely, if the well and electrodes are p type, then the substrate is preferably lightly n doped silicon.

The substrate may be a standard CMOS substrate. The substrate may be provided with an epitaxial layer. The device may be manufactured using standard CMOS processes.

The successive Hall potentials may be measured using one or a progressive succession of sensing electrodes, the or each sensing electrode being exposed to a bias current being applied by a pair of biasing electrodes. The ring of electrodes may act solely as sensing electrodes in response to a bias current applied by dedicated biasing electrodes or may act solely as biasing electrodes operable to apply a progressive succession of bias currents to one or more dedicated sensing electrodes or may operate both as biasing electrodes and as sensing electrodes. Biasing can be achieved either by applying a voltage across the selected biasing electrodes, or by sourcing a current into one selected biasing electrode and draining said current from the other selected biasing electrode.

Electrodes may be operated as sensing electrodes by providing a connection to one or other of a pair of output contacts. The pair of output contacts in turn may be connected to voltage measuring means or may directly comprise the sensor output. In a preferred embodiment, one output contact may be connected to the inverting input of a differential amplifier and the other output contact may be connected to the non-inverting input of said differential amplifier. Said differential amplifier may have a single ended or differential output, as required or desired.

Preferably, the sensor operates cyclically and the full progressive succession cycle involves applying and/or using each electrode in the ring at least once for applying a bias current and/or sensing a Hall potential. In such a manner, the full cycle comprises the progressive succession of the axis of measurement of the sensor through a complete rotation within the plane of the sensor. Preferably, the exposure and/or connection is for an equal time period for each step of the cycle.

In some embodiments, each step in the cycle may involve the simultaneous application of oppositely directed bias currents to pairs of sensing electrodes. In this manner, the sensing electrode pair may generate a differential signal. This increases the magnitude of the measured Hall potential at each step.

In one preferred embodiment, the bias current and connection time for each step in the progressive succession is say 1 μs. In one preferred embodiment, there may be 24 electrodes in the ring. In such an embodiment, if there are 24 electrodes, a full cycle will take 24 μs.

The cycle may take place under the control of a control means. The control means can be integrated with the sensor or may be an external control means. The control means may incorporate a timing unit.

If the magnetic field is constant over the full period of the cycle, the series of output voltages recorded at the contacts will be substantially sinusoidal. By analysing the series of outputs over the full cycle, the orientation of the magnetic field component in the plane of the sensor. Typically, the orientation is determined relative to a predefined axis, which is typically the parallel to the magnetic field component detected by the first step of the cycle. In a first embodiment, this analysis may comprise determining the phase difference between the output signal and a reference signal, the reference signal having a period equal to the duration of one cycle of the cyclical succession. The reference signal is preferably phase matched to the expected output signal generated by a magnetic field component lying parallel to the predefined axis. In a second embodiment, the analysis may comprise determining the phase difference between the output signal obtained from operating the above method in a in a clockwise progression and the output signal obtained from operating the above method in an anticlockwise progression. This may further include the step of halving the determined phase difference to determine the orientation of the magnetic field component relative to the predefined axis. In a third embodiment, the analysis may comprise monitoring the output signal level to determine where the output signal switches from a positive to a negative value and thereby determining the orientation of the magnetic field component relative to the predefined axis.

The raw output signal generated by the above process, comprises a series of discrete values. A low pass filter may thus be provided to smooth the output signal. This helps to obtain an accurate phase during processing. The more steps there are in a full cycle, the less filtering is required for a given accuracy (e.g. 0.1 degree).

In a first preferred embodiment, the circular well is in the form of a ring concentric with the electrode ring. In such embodiments, the electrodes in the electrode ring act both as biasing electrodes and as sensing electrodes at different steps of the cycle. In such an embodiment, at each step of the cycle a pair of opposed electrodes are selected to operate as sensing electrodes and pairs of electrodes on either side of each of the opposed sensing electrodes are utilised as biasing electrodes. The pairs of biasing electrodes are preferably located directly adjacent to each selected sensing electrode. In this manner, the bias current flows tangentially to the ring and the magnetic field component measured at each step is that parallel to the axis connecting the opposed electrodes. By progressively rotating the selected opposed electrode pairs, the axis of sensitivity is progressively rotated.

In a second preferred embodiment the circular well is in the form of a disc provided with dedicated outer and inner biasing electrodes provided over the outer edge of and the centre of the well respectively, the electrode ring being positioned therebetween. In such embodiments, the electrodes in the electrode ring act solely as sensing electrodes.

The inner biasing electrode preferably comprises a disc provided over and concentric with the well. The outer biasing electrode may be provided in the form of a ring concentric with the well. In such an embodiment, at each step of the cycle a pair of opposed electrodes from the electrode ring are operated as sensing electrodes. The biasing current flows radially relative to the disc shaped well and the sensor is thus operable to measure a tangential component of magnetic field. By progressively rotating the selected opposed electrode pairs, the axis of sensitivity is progressively rotated.

In an alternative implementation of the second preferred embodiment, the outer biasing electrode may comprise a ring of dedicated biasing electrodes, each dedicated biasing electrode being radially aligned with one of the ring of sensing electrodes. In such an embodiment, at each step of the cycle a pair of opposed electrodes from the electrode ring are operated as sensing electrodes and the corresponding dedicated biasing electrodes are selected as biasing electrodes. The biasing current flows radially relative to the disc shaped well and the sensor is thus operable to measure a tangential component of magnetic field. By progressively rotating the selected opposed electrode pairs, the axis of sensitivity is progressively rotated.

In a third preferred embodiment the circular well is in the form of a disc provided with a dedicated sensing electrode comprising a disc provided over and concentric with the well, the electrode ring being concentric with and outside said dedicated sensing electrode. In such an embodiment, the electrodes in the electrode ring act solely as sensing electrodes. In such an embodiment, at each step of the cycle a pair of opposed electrodes from the electrode ring are operated as biasing electrodes. The biasing current flows radially relative to the disc shaped well and the sensor is thus operable to measure a tangential component of magnetic field. By progressively rotating the selected opposed electrode pairs, the axis of sensitivity is progressively rotated. In order to achieve a differential output two such sensors may be provided adjacent to one another and operated cooperatively such that oppositely directed bias currents are applied at all times.

According to a second aspect of the present invention there is provided a method of operating a magnetic angle sensor according to the first aspect of the present invention comprising the steps of: applying either to or by the electrode ring a progressive succession of differently directed bias currents; and detecting the successive resultant Hall potentials so as to provide an output signal indicative of the relative magnitudes of successive differently oriented magnetic field components in the plane of the magnetic angle sensor.

The method of the second aspect of the present invention may incorporate any and/or all features of the first aspect of the present invention as desired or as appropriate.

The succession is preferably a cyclical progressive succession. The method may include the further step of processing the output signal to determine the orientation of the local magnetic field component in the plane of the sensing device. The orientation may be determined relative to a predefined axis. The predefined axis is preferably parallel to the magnetic field component measured by the initial step of the cyclical progressive succession.

In a first preferred implementation the processing may comprise: determining the phase difference between the output signal and a reference signal, the reference signal having a period equal to the duration of one cycle of the cyclical succession. The reference signal is preferably phase matched to the expected output signal generated by a magnetic field component lying parallel to the predefined axis. The orientation of the magnetic field component relative to the predefined axis is directly dependent upon the phase difference.

In a second preferred implementation, the processing may comprise: determining the phase difference between the output signal obtained from operating the above method in a in a clockwise progression and the output signal obtained from operating the above method in an anticlockwise progression. The processing may further include the further step of halving the determined phase difference to determine the orientation of the magnetic field component relative to the predefined axis.

In a third preferred implementation, the processing may comprise: monitoring the output signal level to determine where the output signal switches from a positive to a negative value and thereby determining the orientation of the magnetic field component relative to the predefined axis.

So that the invention may be more clearly understood one embodiment will now be described further below, with reference to the accompanying drawings, in which.

Figure 1A:
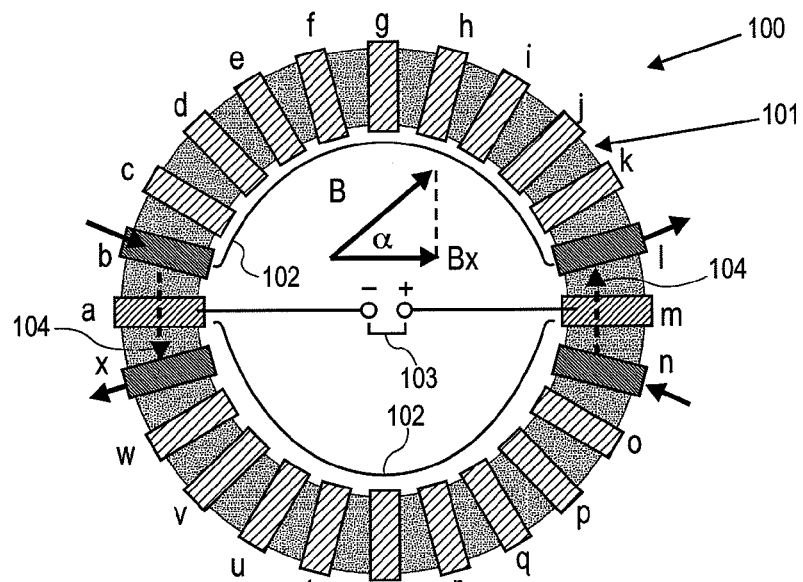
FIG. 1a is a schematic diagram of a first embodiment of a magnetic field orientation sensor according to the present invention.
Figure 3:
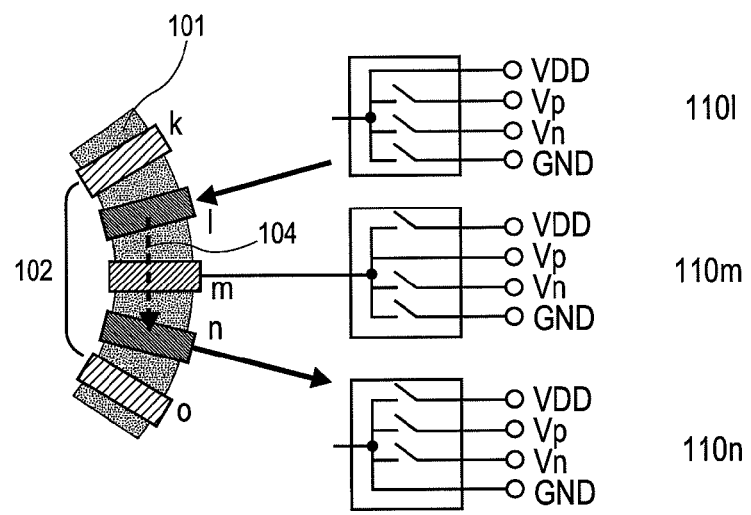
Figure 5:
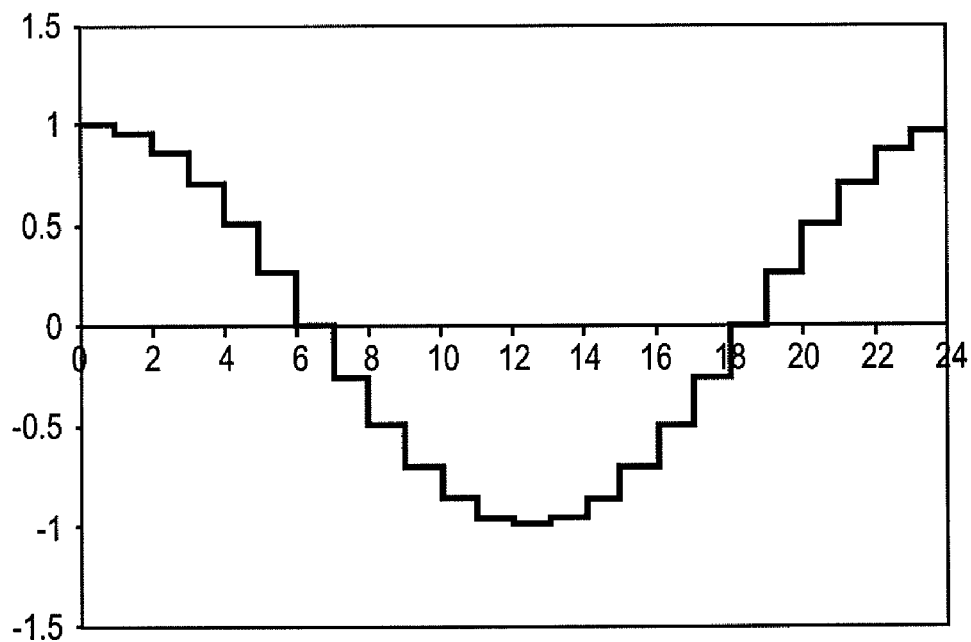
Figure 6:
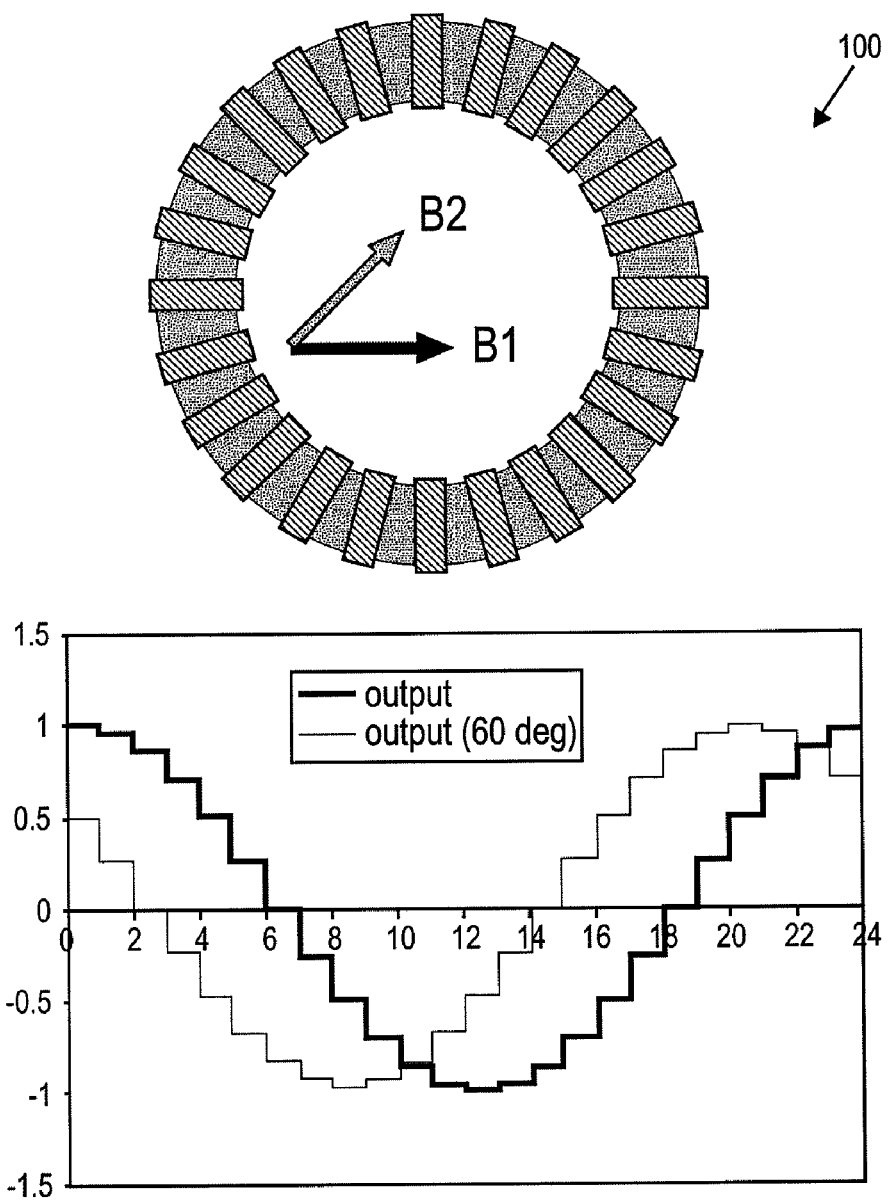
Figure 7:
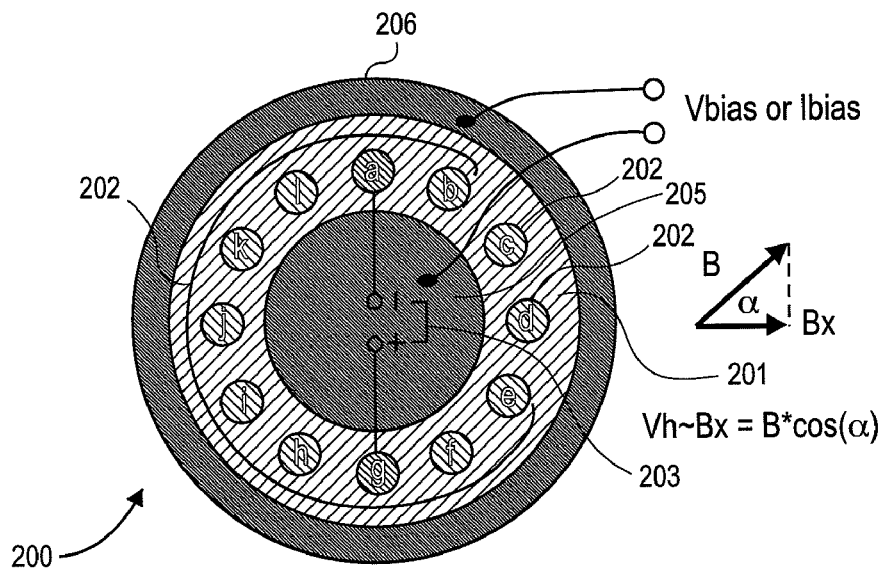
Figure 9:
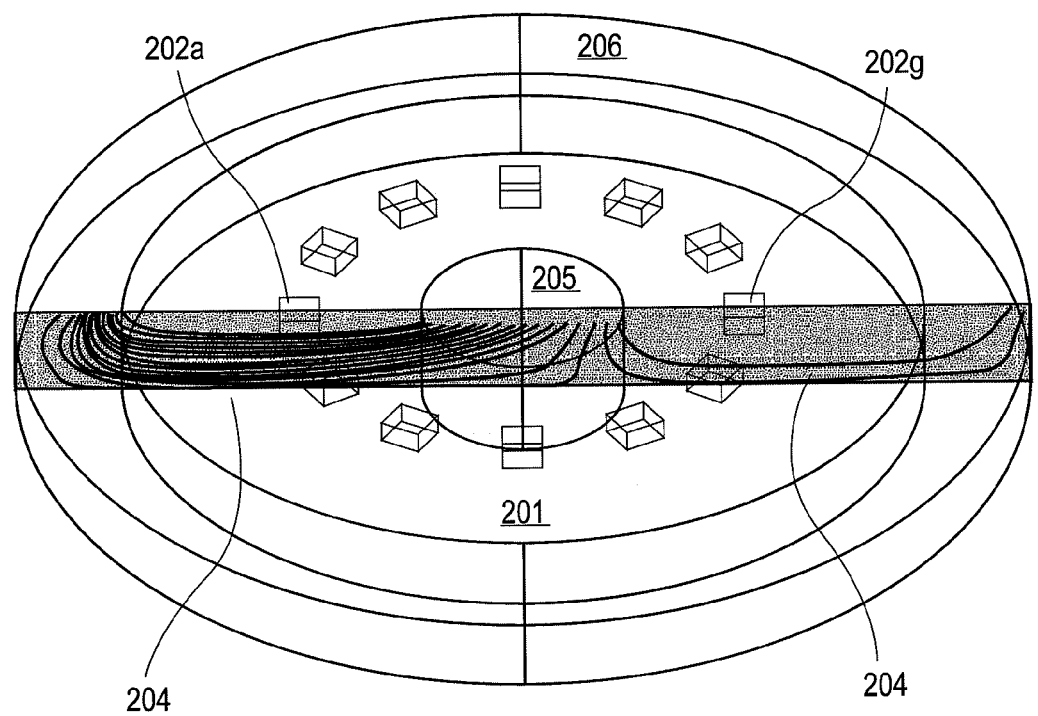
Figure 10:
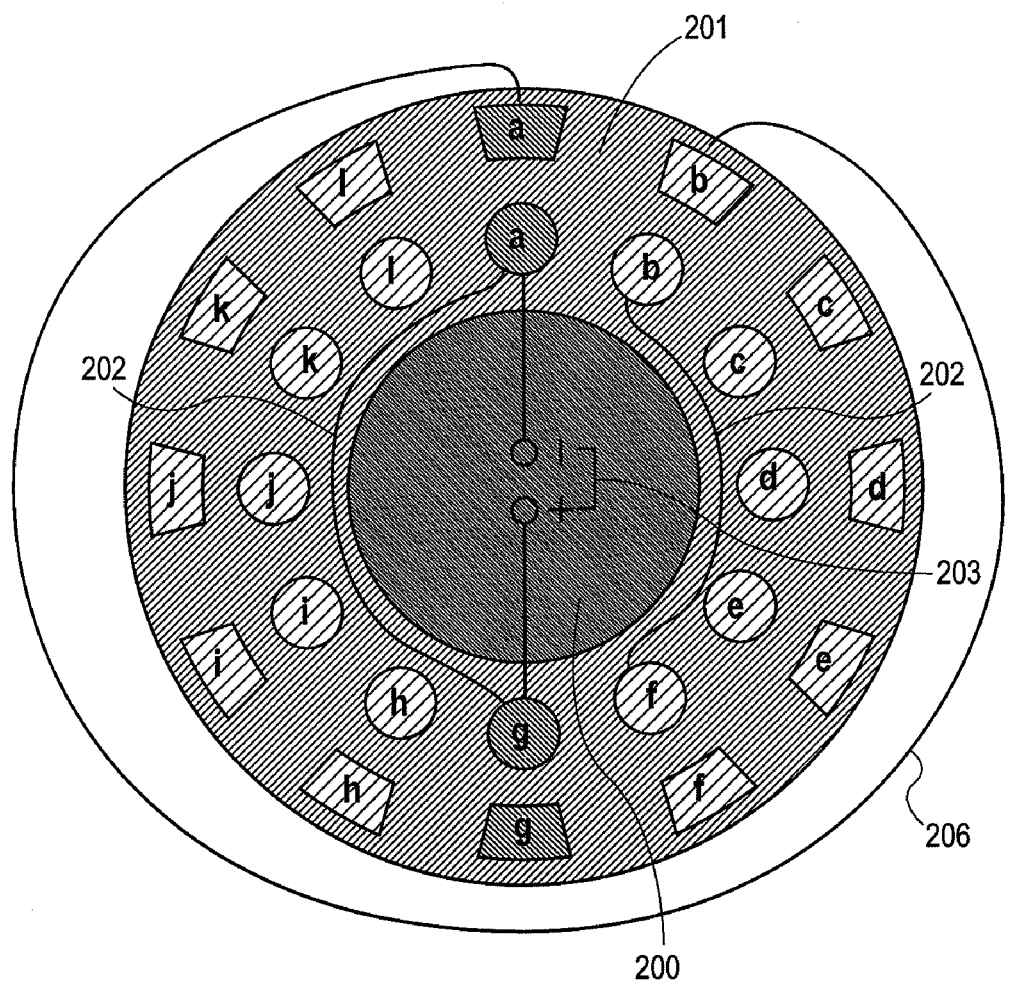
Figure 11:
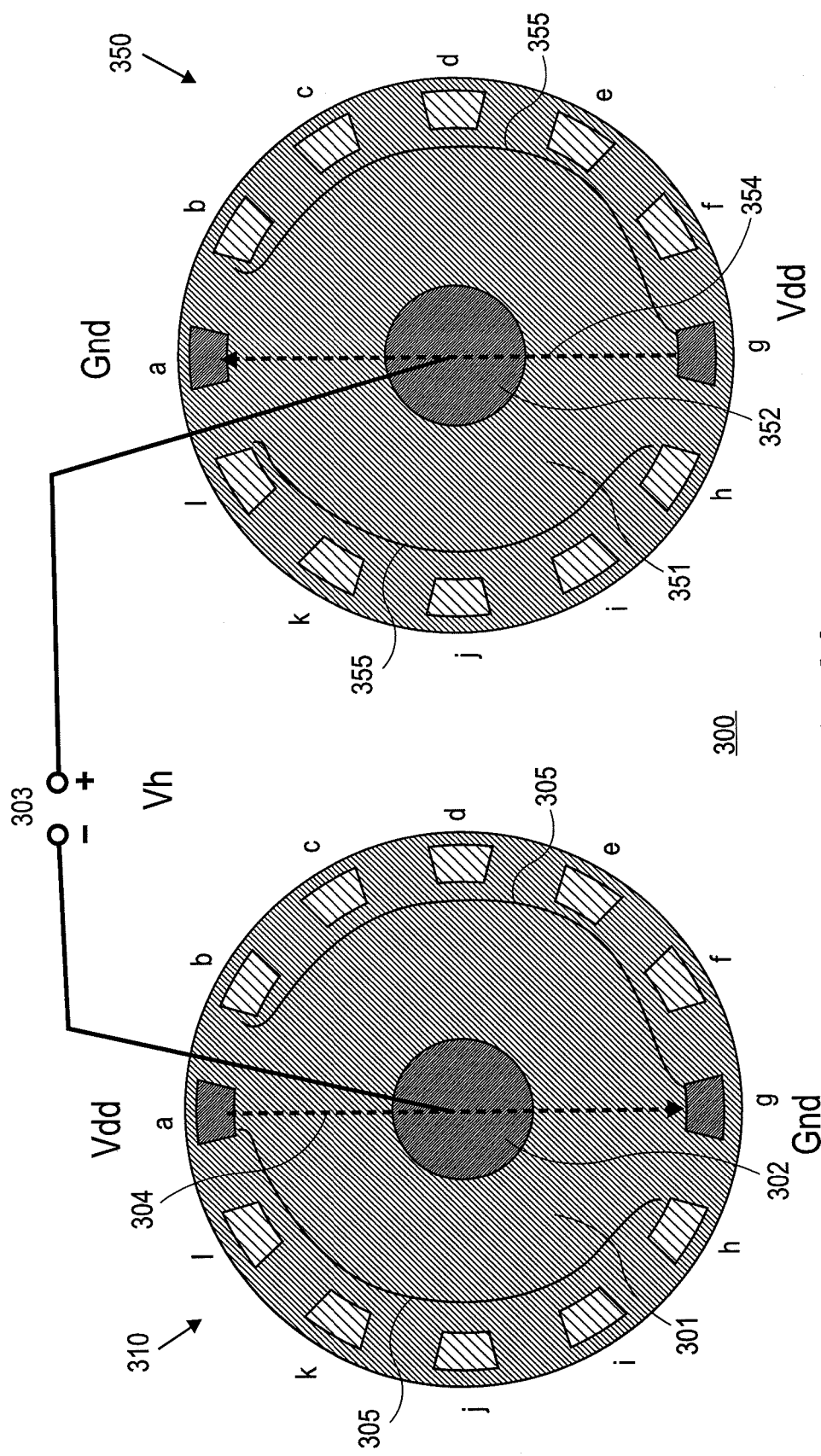
Figure 13:
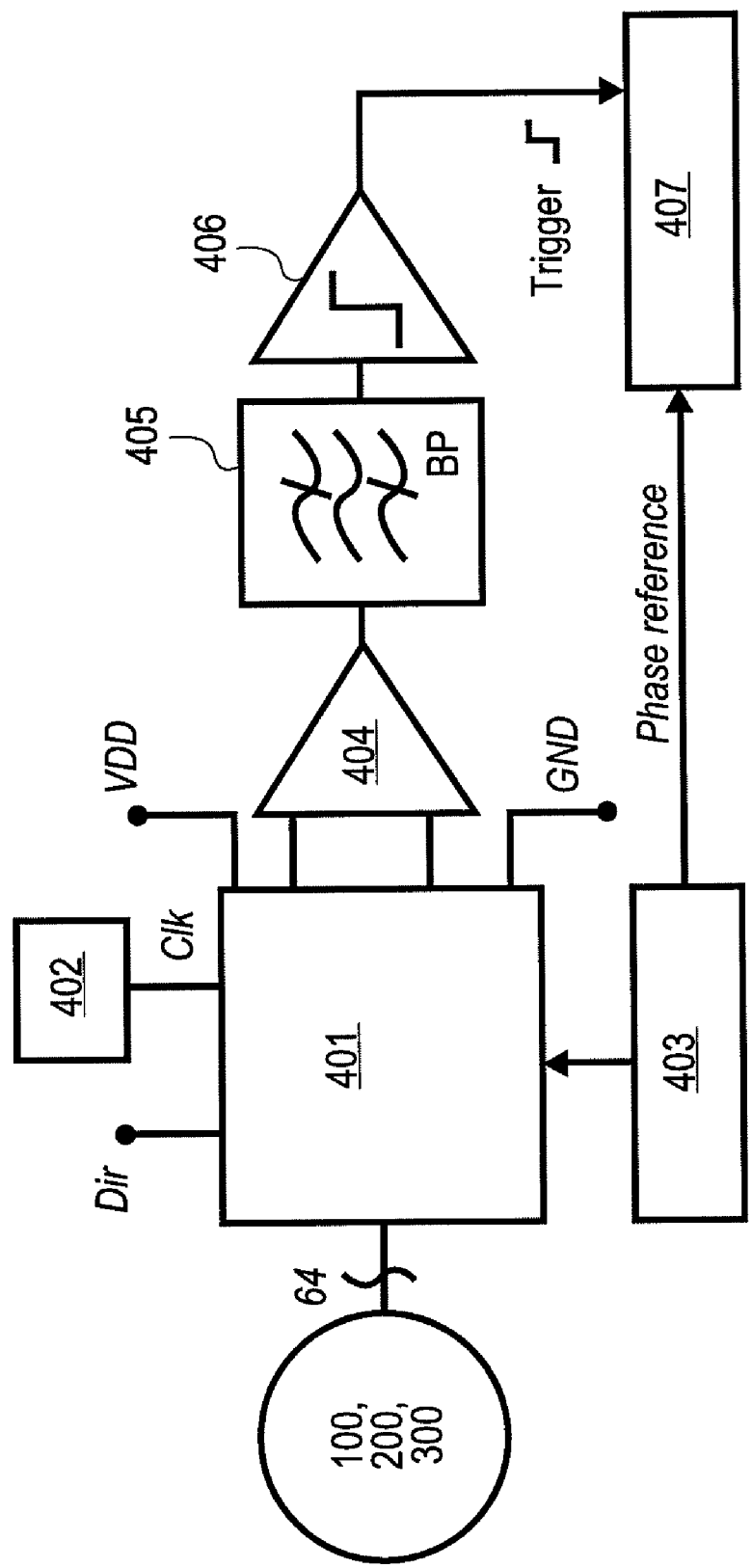

FIGS. 2a-f show a series of sequential steps in the operation of the magnetic field orientation sensor of FIG. 1;

FIG. 3 is a schematic diagram illustrating how the sensing electrodes may be connected electrically in the above embodiment;

FIGS. 4a-b illustrate two possible forms of inverting amplifier that may be used to detect the output of the sensor in the above embodiment;

FIG. 5 is a schematic indication of the variation in measured output over one complete operation cycle of the sensor of FIG. 1;

FIG. 6 is a schematic illustration indicating how the variation in measured output over one complete operation cycle of the sensor of FIG. 1 is dependent upon the magnetic field orientation;

FIG. 7 is a schematic diagram of a second embodiment of a magnetic field orientation sensor according to the second embodiment of the present invention;

FIGS. 8a-f show a series of sequential steps in the operation of the magnetic field orientation sensor of FIG. 7;

FIG. 9 illustrates an example of a variation in current density in the well of the sensor of FIG. 7 due to a magnetic flux;

FIG. 10 is a schematic diagram of a variation upon the magnetic field orientation sensor of FIG. 7 having a segmented outer bias electrode;

FIG. 11 is a schematic diagram of a further embodiment of a magnetic sensor according to the present invention;

FIGS. 12a-d show a series of sequential steps in the operation of the magnetic field orientation sensor of FIG. 11; and FIG. 13 is a schematic diagram of control circuitry suitable for use with the magnetic sensors of FIGS. 1-12.

Turning now to FIG. 1, a magnetic orientation sensor 100 is formed on a suitable substrate and comprises a ring shaped well 101, a plurality of electrodes 102 (in this case 24 electrodes 102a-102x labelling clockwise from the horizontal position on the left) and a pair of output contacts 103. The sensor 100 is operable to determine the orientation of a component of magnetic field B lying in the plane of the sensor 100.

Figure 1B:
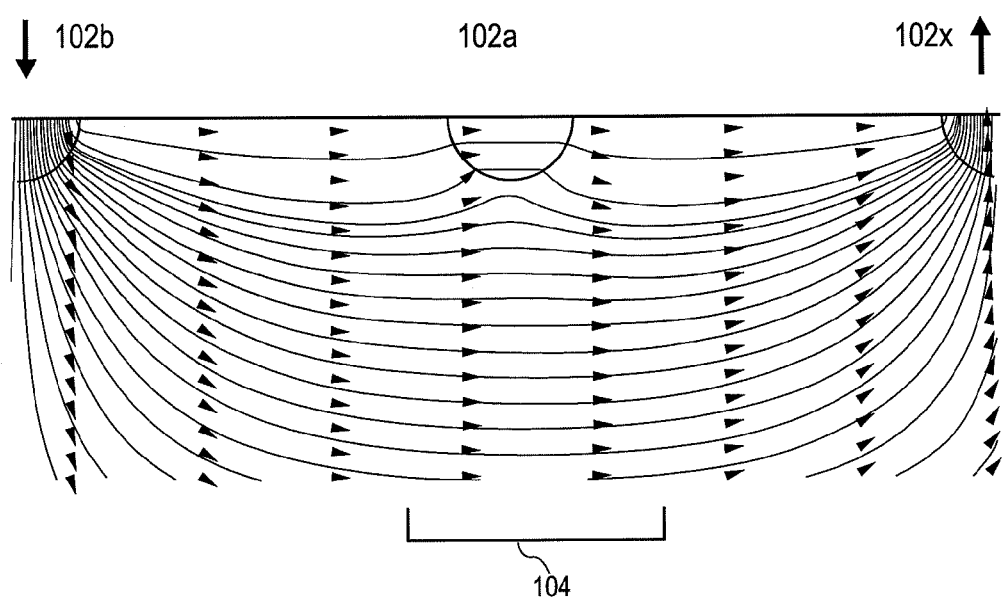
FIG. 1b is a schematic diagram illustrating the flow of bias current in the well under a sensing electrode.
Figure 2:
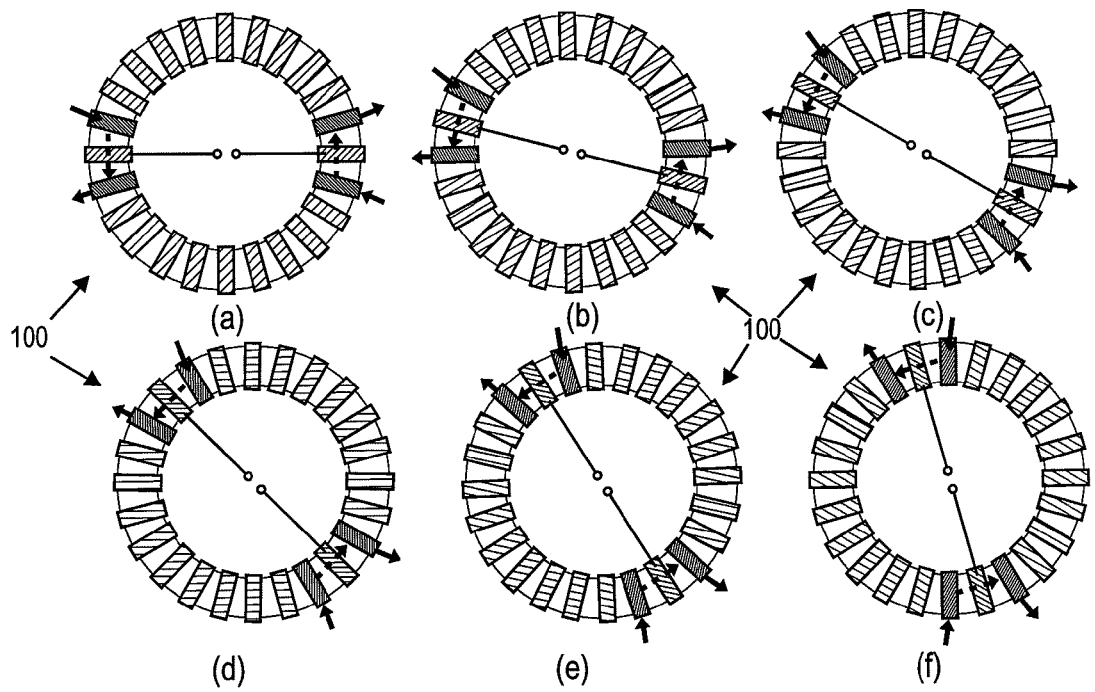

In FIG. 1, a sensor 100 is operable to determine the magnitude of the component Bx of the field B lying in the x-direction (horizontal in this example). This is achieved by connecting diametrically opposed electrodes 102a and 102m to contacts 103. At the same time a bias current 104 is passed through the sections of the ring shaped well upon which electrodes 102a and 102m are provided in a tangential direction. The bias current 104 is generated by operating the adjacent electrodes 102b, 102x and 102l, 102n as biasing electrodes for 102a and 102m respectively. As a result of the magnetic field component Bx and the bias current 104 flowing past 102a, a Hall potential develops at both 102a and 102m. The electrodes 102a and 102m thus act as a pair of Hall elements. As is illustrated in FIG. 1b, the well 101 must be sufficiently deep that the bias current does not just run along the surface of the well 101, otherwise no Hall voltage will be generated at the sensing electrode 102a.

Figure 4:
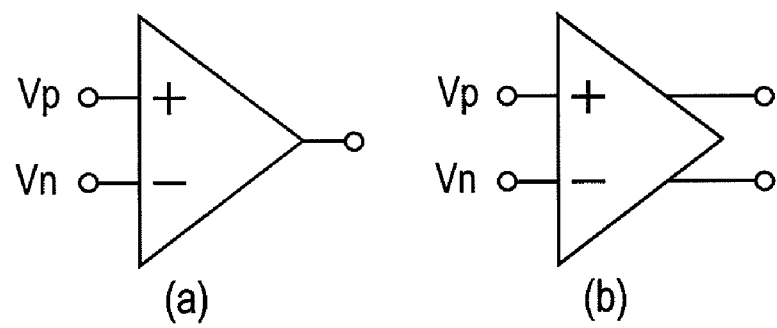

As the bias currents 104 at 102a and 102m are oppositely directed relative to the field, an opposite Hall potential develops at 102a and 102m. As such, the potential difference Vh at the contacts 103 is substantially equal and opposite. Furthermore, Vh is proportional to Bx. As such it provides an indication of the magnitude of Bx. The contacts 103 are connected to the inverting Vn and non-inverting Vp inputs of a differential amplifier. As is illustrated in FIG. 4, the differential amplifier may be of the type having a single-ended output (FIG. 4a) or may be f the type having a differential output (FIG. 4b). This can be achieved by the provision of a four way switch 110a-110x for each electrode 102a-102x, as is illustrated in FIG. 3 for the electrodes 102l-102n.

In order to determine the orientation angle α of the field component B relative to the x-direction, diametrically opposed pairs are sequentially connected to the contacts and exposed to a bias current 104. This is shown in FIGS. 2a-2f as an example of the first six stages in such a cycle. First the opposing electrode pair 102a and 102m are connected to the contacts and exposed to a bias current 104 as is detailed in respect of FIG. 1 above. Following this, as shown in FIG. 2b, electrodes 102b and 102n are connected to the contacts 103 and exposed to a bias current 104 from biasing electrodes 102a, 102c and 102m, 102o respectively. In FIG. 2c, electrodes 102c and 102o are connected to the contacts 103 and exposed to a bias current 104 from biasing electrodes 102b, 102d and 102n, 102p respectively. In FIG. 2d, electrodes 102d and 102p are connected to the contacts 103 and exposed to a bias current 104 from biasing electrodes 102c, 102e and 102o, 102q respectively. In FIG. 2e, electrodes 102e and 102q are connected to the contacts 103 and exposed to a bias current 104 from biasing electrodes 102d, 102f and 102p, 102r respectively. In FIG. 2f, electrodes 102f and 102r are connected to the contacts 103 and exposed to a bias current 104 from biasing electrodes 102e, 102g and 102q, 102s respectively.

The above sequence continues until each electrode in each possible opposing electrode pair has been connected to each of the contacts 103 once and exposed to a bias current 104. When a pair of electrodes is connected to the opposite contacts, the direction of the bias current is also reversed. For example a pair of electrodes may experience a clockwise bias current 104 when one electrode is connected to the contact 103 connected to the non-inverting input and may experience an anti-clockwise bias current 104 when the other electrode of the pair is connected to the contact 103 connected to the non-inverting input. Accordingly, a full field orientation direction cycle for the sensor of FIG. 1 incorporates 24 sequential steps.

In a typical embodiment, each step may occupy an equal time period of the order of 1 µs, resulting in a total cycle time of 24 µs. An example of the resultant series of potentials Vh recorded at the contacts 103 over a full cycle wherein the field component lies in the x-direction is shown in FIG. 5. As can clearly be seen, it has a sinusoidal form. Due to the form of the output signal being AC, a high pass filter may be used to eliminate any offset error in the resultant signal due to preamplification.

Obtaining a potential Vh by this method not only increases the magnitude of the signal but also results in the suppression of first order offset caused by manufacturing tolerances like mask-misalignment or doping gradients. Of course the skilled man will understand that the measurement of a single phase does not yet provide for full offset suppression. This is achieved by monitoring the output from phase to phase. As an example: imagine all electrodes are equally spaced with the exception of 102a and 102b, which are closer together than the other pairs. In phase one, 102a sees a positive offset voltage, since it is closer to 102b than to 102x. In the next phase, the biasing is from electrode 102c to 102a. Now 102b sees a negative offset, since it is closer to 102a than to 102c. As the same error will occur on the next sensing run, it has no effect on the relative phase measured from cycle to cycle. Additionally or alternatively, the sensor 100 could add two subsequent phases into one output voltage. By doing so, the offset generated from the common active area (the area between the two electrodes which are common to both phases) is suppressed, since once positive and once negative.

In order to determine the orientation of the field component B relative to a predetermined axis, three different methods can be applied. A first method is to determine the phase difference between the resultant signal and a reference signal of the same frequency as the cycle time but with a phase aligned with the predetermined axis. This is schematically illustrated by FIG. 6, which shows (rather than a reference signal) a pair of output signals resulting from two different field orientations B1 (aligned with the x-direction) and B2 (at 60° to the x-direction). As can be seen the phase of the resultant signal from B2 leads the phase of B1 by 60°, as such it is clear that the angle between B1 and B2 is 60°.

An alternative method of determining the field direction relative to a predetermined axis is to run two full cycles around the sensor electrodes 102: one in a clockwise direction and one in an anticlockwise direction, both cycles starting from a position where the line linking the diametrically opposed electrodes is parallel to the predetermined axis. The phase difference of the two resultant signals is then determined. As one signal will be delayed by a phase angle equal to the angle between the field component and the predetermined axis and the other signal will be advanced by the same amount, halving the determined phase difference will obtain the required field orientation.

A third method that can be used is to determine the zero crossing points of the output signal and thereby determine the orientation of the field.

Turning now to FIG. 7, an alternative sensor embodiment 200 is shown. In this embodiment the well 201 is in the form of a disc. A plurality of sensing electrodes 202a-202l are spaced at regular intervals around an inner disc shaped biasing electrode 205 concentric within the well 201. An outer ring shaped biasing electrode 206 is provided over the outer portion of the well 201. By applying a suitable voltage across the biasing electrodes 205, 206 (or connecting a current source to one biasing electrode 205, 206 and a current drain to the other biasing electrode 206, 205), a radially directed bias current will flow in the well 201. Accordingly, each of the sensing electrodes 202a-202l will experience a Hall potential proportional to the local tangential component of magnetic field. This is illustrated in FIG. 9 wherein it can be seen that due to the application of a magnetic flux B, the current density lines of the bias current 204 are deflected up on the left part of the figure and down on the right half of the figure causing a positive Hall potential on electrode 202a and a negative magnetic flux on electrode 202g.

Figure 8:
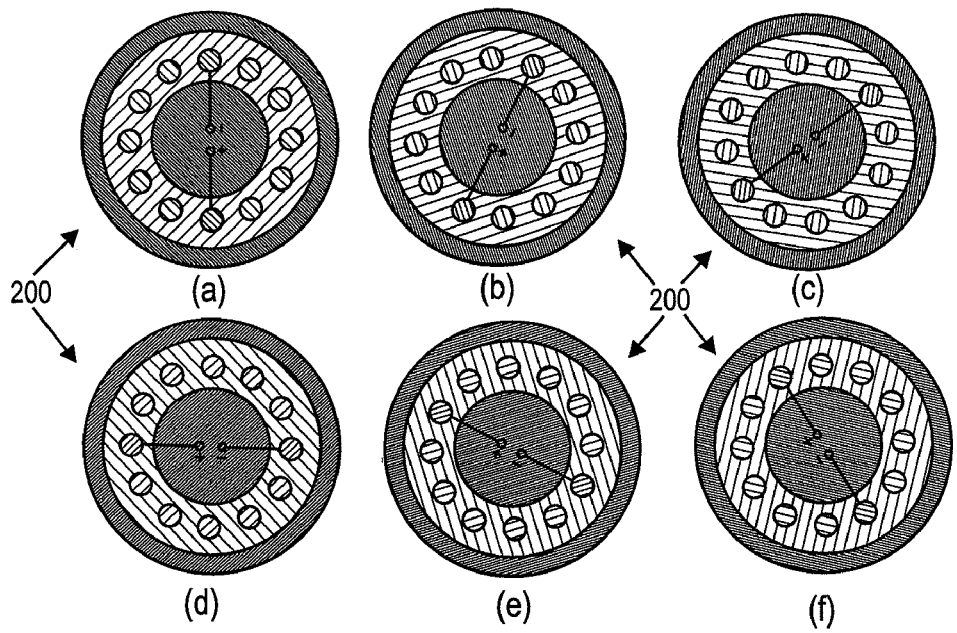

As in the previous embodiment, pairs of opposing sensing electrodes 202a and 202g, 202b and 202h etc may each be connected to a pair of output contacts 203, in turn to generate an output for determining the orientation angle α of the field component B relative to the x-direction. The first six steps of this cycle are illustrated in FIG. 8.

Turning now to FIG. 8a, first the opposing electrode pair 202a and 202g are connected to the contacts 203 and exposed to a bias current 204 from biasing electrodes 205, 206. Following this, as shown in FIG. 8b, electrodes 202b and 202h are connected to the contacts 203 and exposed to a bias current 204 from biasing electrodes 205, 206. Following this, as shown in FIG. 8c, electrodes 202c and 202i are connected to the contacts 203 and exposed to a bias current 204 from biasing electrodes 205, 206. Following this, as shown in FIG. 8b, electrodes 202d and 202j are connected to the contacts 203 and exposed to a bias current 204 from biasing electrodes 205, 206. Following this, as shown in FIG. 8b, electrodes 202e and 202k are connected to the contacts 203 and exposed to a bias current 204 from biasing electrodes 205, 206. Following this, as shown in FIG. 8b, electrodes 202f and 202l are connected to the contacts 203 and exposed to a bias current 204 from biasing electrodes 205, 206.

The above sequence continues until all the possible opposing electrode pairs have been connected to the contacts 203 and exposed to a bias current 204 once. As in the previous embodiment, the output contacts 203 are connected to the inverting and non-inverting inputs of a differential amplifier and the sequence of readings from each successive pair of electrodes 202a and 202g, 202b and 202h etc are substantially sinusoidal. The same processing techniques that have been described in respect of the first embodiment 100 of the present invention may be used in respect of this embodiment 200 to determine the orientation of the field component.

With regard to the first embodiment 100, the second embodiment 200 has a number of advantages. Firstly, the second embodiment 200 does not require any switches on the current path, since the biasing electrodes 205, 206 may remain static (of course they can be reversed if needed).

Secondly, in the second embodiment 200 each of the sensing electrodes 202a-202l is connected via one switch to the contacts 203. Since the sensing switches do not conduct any current, they can be made very small, which allows a very high number of sensing contacts to be implemented in a single sensor 200, e.g. 64 or 128. This can increase the potential accuracy of the sensor 200. A high number of sensing electrodes 202a-202l also provides for good offset averaging and also for smaller steps to low-pass filter. For best operation, the sensor 200 may be adapted to averages the offset values over one rotation by a low-pass filter which turns the step-wise output into a smooth sine curve. The averaged value can then be cut off by a high-pass filter There are however some disadvantages of the second embodiment 200 with respect to the first embodiment 100, these include the fact that there is no offset reduction following the spinning current principle. Additionally, the second embodiment 200 has a relative higher current consumption, since the current shows a radial flow along all directions, only part of which is effectively utilised at any one time. In a possible variation of this embodiment, each pair of sensing electrodes 202a and 202g, 202b and 202h etc. could be provided with a dedicated permanent connection to an amplifier such that simultaneous measurement of the Hall potentials across each pair of sensing electrodes can be made, thereby speeding up the sensor operation. In such a variation, an increased bias current 204 would be needed, which would therefore require additional input power.

A further possible alternative embodiment is shown in FIG. 10. This embodiment is a variant of the embodiment of FIG. 7 wherein the single outer biasing electrode 206 is replaced by a plurality of outer biasing electrodes 206a-206l each associated with one of the sensing electrodes 202a-202l respectively. When an opposed pair of sensing electrodes 202a, 202g are connected to the contacts 203, the respective outer biasing electrodes 206a, 206g are connected to a suitable voltage (or current supply/drain) to generate a radial bias current 204 in the region of the selected sensing electrodes 202a, 202g. This variant advantageously reduces the current consumption with respect to the previous embodiment but does require additional switches to be provided to enable each outer biasing electrode 206a-206l to be selected in turn.

Turning now to FIGS. 11 and 12 a further possible embodiment of a magnetic orientation sensor according to the present invention is shown. The sensor 300 comprises a pair of active sensing areas 310, 350 comprising circular n wells 301, 351 respectively. At the centre of each n well 301, 351 is provided a sensing electrode 302, 352 respectively formed from n+ material. The sensing electrodes 302, 352 are connected to a pair of contacts 303, which similarly to the embodiments described above are connected to the inverting and non-inverting inputs of a differential amplifier (not shown).

In order that the sensing electrodes 302, 352 can be used as Hall elements, the sensing electrodes 302, 352 can be exposed to bias current 304, 354 in a plurality of different directions by use of the biasing electrodes 305a-305l and 355a-355l. In use, a pair of opposed biasing electrodes for each sensing area 310, 350 are selected. In FIG. 11, the pair 305a and 305g are selected for area 310 and the pair 355a and 355g are selected for area 350. Biasing is achieved by applying a voltage across the selected opposed electrode pairs 305a, 305g and 355a, 355g. Alternatively, biasing may be achieved by applying a current source to one electrode of each pair and a current drain to the other.

As is shown in FIG. 11, the bias currents 304 and 354 are oppositely directed. In this manner whilst the sensing electrodes 302 and 352 will experience a Hall potential as a result of the same (in this case horizontally directed) field component, the sign of the Hall potential will be different. Accordingly a differential signal will be produced at the contacts 303. It will be apparent to the skilled man that it is possible to sense a field component with a bias current applied to only one of the sensing areas 310, 350 and with one of contacts 303 connected to a reference voltage. Such an arrangement would however generate a much smaller output signal.

In use, the sensor 300 is operable such that each pair of opposed biasing electrodes is selected sequentially to apply a bias current to the sensing electrodes 302, 352 in a first direction and then later in the sequence to apply a bias current in the opposite direction. By way of example, the first four steps of this sequence are illustrated in FIGS. 12a-12d. In FIG. 12a, a bias current 304 flows between biasing electrodes 305a and 305g in sensing area 310, whilst in sensing area 350, a bias current 354 flows between biasing electrodes 355a and 355g. At the next step shown in FIG. 12b, a bias current 304 flows between biasing electrodes 305b and 305h in sensing area 310, whilst in sensing area 350, a bias current 354 flows between biasing electrodes 355b and 355h. At the next step shown in FIG. 12c, a bias current 304 flows between biasing electrodes 305c and 305i in sensing area 310, whilst in sensing area 350, a bias current 354 flows between biasing electrodes 355c and 355i. At the next step shown in FIG. 12d, a bias current 304 flows between biasing electrodes 305d and 305j in sensing area 310, whilst in sensing area 350, a bias current 354 flows between biasing electrodes 355d and 355j.

The above sequence continues until all the possible opposing biasing electrode pairs have generated a bias current 304, 354 in each direction once. As in the previous embodiment, the output contacts 303 are connected to the inverting and non-inverting inputs of a differential amplifier and the sequence of readings from each successive step are substantially sinusoidal. The same processing techniques that have been described in respect of the first embodiment 100 and second embodiment 200 of the present invention may be used in respect of this embodiment 300 to determine the field component orientation.

In each of the above embodiments 100, 200, 300, the processing may be carried out by a control means integrated with the sensor 100, 200, 300 or remote from the sensor 100, 200, 300, as is required or desired. An example of one suitable form of control circuitry 400 is shown in FIG. 13. In this arrangement, the electrodes of the sensor 100, 200, 300 are connected to a switching unit 401. The switching unit is operable to connect the appropriate biasing electrodes to the appropriate bias supplies and to connect the sensing electrodes to the differential amplifier 404. In view of the number of required by the sensor embodiments being up to 64 (=2⁶), the switching unit is operable to provide a 64 way connection and switching capability. An oscillator 402 provides a reference clock signal and a 6-bit counter 403 keeps track of the phase reference of the switching unit as it progresses through its cycle.

The differential amplifier 404 receives the output signals from the selected sensing electrodes. After amplification, these signals are passed to a band pass filter 405. The low frequency cut off of the filter 405 smoothes the steps from the output signal whilst the high frequency cut off serves to eliminate offset induced by the amplifier 404.

After passing the filter 405, the output signal is passed to further processing circuitry for analysis. In the illustrated example, the circuit 400 is operable to determine the orientation of the magnetic field by the position of the zero crossings in the output signal. Accordingly, the output signal of filter 405 is input to a zero crossing comparator 406. When the comparator 406 is triggered by a zero crossing in the signal, the triggering is noted in an output register 407. As the output register 407 receives an input from the counter 403, it can determine the bias electrodes and/or sensing electrodes in operation before and after the zero crossing and hence determine the orientation of the field.

In alternative embodiments or implementations, alternative electronics may be provided. In particular it is possible for the output of the sensor 100, 200, 300 to be converted to a digital signal and processed using a suitable digital signal processor, if desired or if appropriate.

It is of course to be understood that the invention is not to be restricted to the details of the above embodiment which is described by way of example only.

The invention claimed is:

1. A magnetic angle sensor comprising:
a bulk substrate;
a circular well in a form of a disc provided upon the bulk substrate;
a central electrode in a form of a disc provided over and concentric with said circular well;
an even numbered plurality of electrodes spaced at regular intervals in a ring formation over the circular well; the electrode ring being concentric with and outside the central electrode; and
means for selectively applying a progressive succession of differently directed bias currents to said ring of electrodes and/or means for using the said ring of electrodes to provide a succession of Hall potentials indicative of the relative magnitude of successive differently oriented magnetic field components in the plane of the magnetic angle sensor.

2. A magnetic angle sensor as claimed in claim 1 wherein successive Hall potentials are measured using one or a progressive succession of sensing electrodes, each sensing electrode being exposed to a bias current being applied by a pair of biasing electrodes.

3. A magnetic angle sensor as claimed in claim 1 wherein a low pass filter is provided to smooth the output signal.

4. A magnetic angle sensor as claimed in claim 1 wherein electrodes are operated as biasing electrodes by applying a voltage across the selected biasing electrodes, or by sourcing a current into one selected biasing electrode and draining said current from the other selected biasing electrode and wherein electrodes are operated as sensing electrodes by providing a connection to one or other of a pair of output contacts, the pair of output contacts in turn being connected to voltage measuring means or directly comprising the sensor output.

5. A magnetic angle sensor as claimed in claim 1 wherein the sensor operates cyclically and a full progressive succession cycle involves applying and/or using each electrode in the ring at least once for applying a bias current and/or sensing a Hall potential.

6. A magnetic angle sensor as claimed in claim 5 wherein the exposure and/or connection is for an equal time period for each step of the cycle.

7. A magnetic angle sensor as claimed in claim 5 wherein each step in the cycle involves the simultaneous application of oppositely directed bias currents to pairs of sensing electrodes to generate a differential output signal.

8. A magnetic angle sensor as claimed in claim 1 wherein the central electrode acts as a central biasing electrode and where a dedicated outer biasing electrode is provided over the outer edge of the well, the electrode ring being positioned therebetween.

9. A magnetic angle sensor as claimed in claim 8 wherein the outer biasing electrode comprises a ring concentric with the well.

10. A magnetic angle sensor as claimed in claim 9 wherein at each step of the cycle a pair of opposed electrodes from the electrode ring are operated as sensing electrodes.

11. A magnetic angle sensor as claimed in claim 8 wherein the outer biasing electrode comprises a ring of dedicated biasing electrodes, each dedicated biasing electrode being radially aligned with one of the ring of sensing electrodes.

12. A magnetic angle sensor as claimed in claim 11 wherein at each step of the cycle a pair of opposed electrodes from the electrode ring are operated as sensing electrodes and the corresponding dedicated biasing electrodes are selected as biasing electrodes.

13. A magnetic angle sensor as claimed in claim 1 wherein the central electrode acts as a dedicated sensing element.

14. A magnetic angle sensor as claimed in claim 13 wherein at each step of the cycle a pair of opposed electrodes from the electrode ring are operated as biasing electrodes.

15. A magnetic angle sensor as claimed in claim 13 wherein two such sensors are provided adjacent to one another and operated cooperatively such that oppositely directed bias currents are applied at all times to provide a differential output.

16. A method of operating a magnetic angle sensor according to claim 1, the method comprising:
    applying either to or by the electrode ring a cyclical progressive succession of differently directed bias currents;
    detecting the successive resultant Hall potentials so as to provide an output signal indicative of the relative magnitudes of successive differently oriented magnetic field components in the plane of the magnetic angle sensor; and
    processing the output signal relative to a reference to determine the orientation of the local magnetic field component in the plane of the sensing device.

17. A method as claimed in claim 16 wherein the reference is a reference signal and wherein the further processing includes determining the phase difference between the output signal and the reference signal, the reference signal having a period equal to the duration of one cycle of the cyclical succession and being phase matched to the expected output signal generated by a magnetic field component lying parallel to a predefined axis, and wherein the predefined axis is parallel to the magnetic field component measured by the initial step of the cyclical progressive succession.

18. A method as claimed in claim 16 wherein the further processing includes determining the phase difference between the output signal obtained from operating the above method in a clockwise progression and the reference being a second signal obtained from operating the above method in an anticlockwise progression.

19. A method as claimed in claim 16 wherein the further processing includes monitoring the output signal level to determine where the output signal switches from a positive to a negative value relative to the reference, and wherein the reference is a stored reference value.

* * * * *